US010050104B2

(12) United States Patent
Jou et al.

(10) Patent No.: US 10,050,104 B2
(45) Date of Patent: Aug. 14, 2018

(54) CAPACITOR HAVING A GRAPHENE STRUCTURE, SEMICONDUCTOR DEVICE INCLUDING THE CAPACITOR AND METHOD OF FORMING THE SAME

(71) Applicant: TAIWAN SEMICONDUCTOR MANUFATURING COMPANY, LTD., Hsinchu (TW)

(72) Inventors: Chewn-Pu Jou, Hsinchu (TW);
Chih-Hsin Ko, Fongshan (TW);
Po-Wen Chiu, Hsinchu (TW);
Chao-Ching Cheng, Hsinchu (TW);
Chun-Chieh Lu, Taipei (TW);
Chi-Feng Huang, Zhubei (TW);
Huan-Neng Chen, Taichung (TW);
Fu-Lung Hsueh, Hsin-Chu (TW);
Clement Hsingjen Wann, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 15 days.

(21) Appl. No.: 14/464,497

(22) Filed: Aug. 20, 2014

(65) Prior Publication Data
US 2016/0056228 A1 Feb. 25, 2016

(51) Int. Cl.
*H01L 49/02* (2006.01)
*H01L 21/768* (2006.01)
(Continued)

(52) U.S. Cl.
CPC .............. *H01L 28/75* (2013.01); *H01G 4/005* (2013.01); *H01G 4/008* (2013.01); *H01L 23/5223* (2013.01); *H01L 23/5283* (2013.01); *H01L 23/53276* (2013.01); *C01B 2204/04* (2013.01); *C01B 2204/32* (2013.01); *H01L 21/76852* (2013.01); *H01L 23/5226* (2013.01); *H01L 23/53214* (2013.01); *H01L 23/53228* (2013.01);
(Continued)

(58) Field of Classification Search
CPC . H01L 28/75; H01L 23/5226; H01L 23/5223; H01L 23/53276; H01L 23/522–23/53295; H01L 21/768–21/76898; H01L 28/40–28/92; C01B 2204/04; C01B 32/182–32/198; C01B 2204/00–2204/32; H01G 4/008; H01G 4/30–4/308; H01G 4/00–4/40
See application file for complete search history.

(56) References Cited

U.S. PATENT DOCUMENTS 6,037,621 A 3/2000 Wilson
6,144,546 A 11/2000 Mizushima et al.
(Continued)

FOREIGN PATENT DOCUMENTS

KR 20140061278 A 5/2014
TW 201350969 A 12/2013
WO 2012008789 A2 1/2012

*Primary Examiner* — Kevin Parendo
(74) *Attorney, Agent, or Firm* — Slater Matsil, LLP

(57) ABSTRACT

A capacitor includes a first graphene structure having a first plurality of graphene layers. The capacitor further includes a dielectric layer over the first graphene structure. The capacitor further includes a second graphene structure over the dielectric layer, wherein the second graphene structure has a second plurality of graphene layers.

22 Claims, 4 Drawing Sheets

(51) Int. Cl.
  *H01L 23/522*  (2006.01)
  *H01L 23/528*  (2006.01)
  *H01L 23/532*  (2006.01)
  *H01G 4/005*  (2006.01)
  *H01G 4/008*  (2006.01)

(52) U.S. Cl.
  CPC .. *H01L 23/53257* (2013.01); *H01L 23/53266* (2013.01); *H01L 2924/0002* (2013.01)

(56) References Cited

U.S. PATENT DOCUMENTS

| | | |
|---|---|---|
| 2010/0134646 A1 | 6/2010 | Tamura |
| 2010/0295188 A1* | 11/2010 | Han .................. H01L 21/76801 257/774 |
| 2011/0003453 A1* | 1/2011 | Jang .............................. 438/381 |
| 2011/0204474 A1 | 8/2011 | Kreupl et al. |
| 2012/0080661 A1 | 4/2012 | Saito et al. |
| 2012/0146743 A1* | 6/2012 | Ermolov ....................... 333/161 |
| 2014/0061916 A1 | 3/2014 | Saito et al. |
| 2014/0070425 A1* | 3/2014 | Wada et al. ................... 257/774 |
| 2014/0084250 A1* | 3/2014 | Wada ............... H01L 23/53276 257/29 |
| 2014/0167268 A1 | 6/2014 | Bao et al. |
| 2015/0061133 A1* | 3/2015 | Isobayashi et al. .......... 257/746 |
| 2015/0109719 A1* | 4/2015 | Yun et al. ..................... 361/502 |
| 2015/0155287 A1* | 6/2015 | Heo .................. H01L 29/7606 257/29 |
| 2015/0163923 A1* | 6/2015 | Currie et al. .................... 29/846 |
| 2015/0168747 A1* | 6/2015 | Kadono et al. ............... 348/360 |
| 2015/0262940 A1* | 9/2015 | Kitamura .......... H01L 23/53276 257/741 |

* cited by examiner

CAPACITOR HAVING A GRAPHENE STRUCTURE, SEMICONDUCTOR DEVICE INCLUDING THE CAPACITOR AND METHOD OF FORMING THE SAME

BACKGROUND

Capacitors which include metallic electrodes, such as metal oxide metal (MOM) or metal insulator metal (MIM) capacitors, use metallic components such as aluminum or copper in order to form the capacitors. An MOM capacitor has an ability to store less than 10 femtoFarads per square micron ($fF/\mu m^2$). An MIM capacitor has an ability to store about 30 $fF/\mu m^2$ to about 100 $fF/\mu m^2$.

In some instances, a storage ability per unit area is increased using dielectric material having a high dielectric constant, i.e., a high-k dielectric material. In some instances, a storage ability per unit area is increased using a thin electrode formed by atomic layer deposition (ALD).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
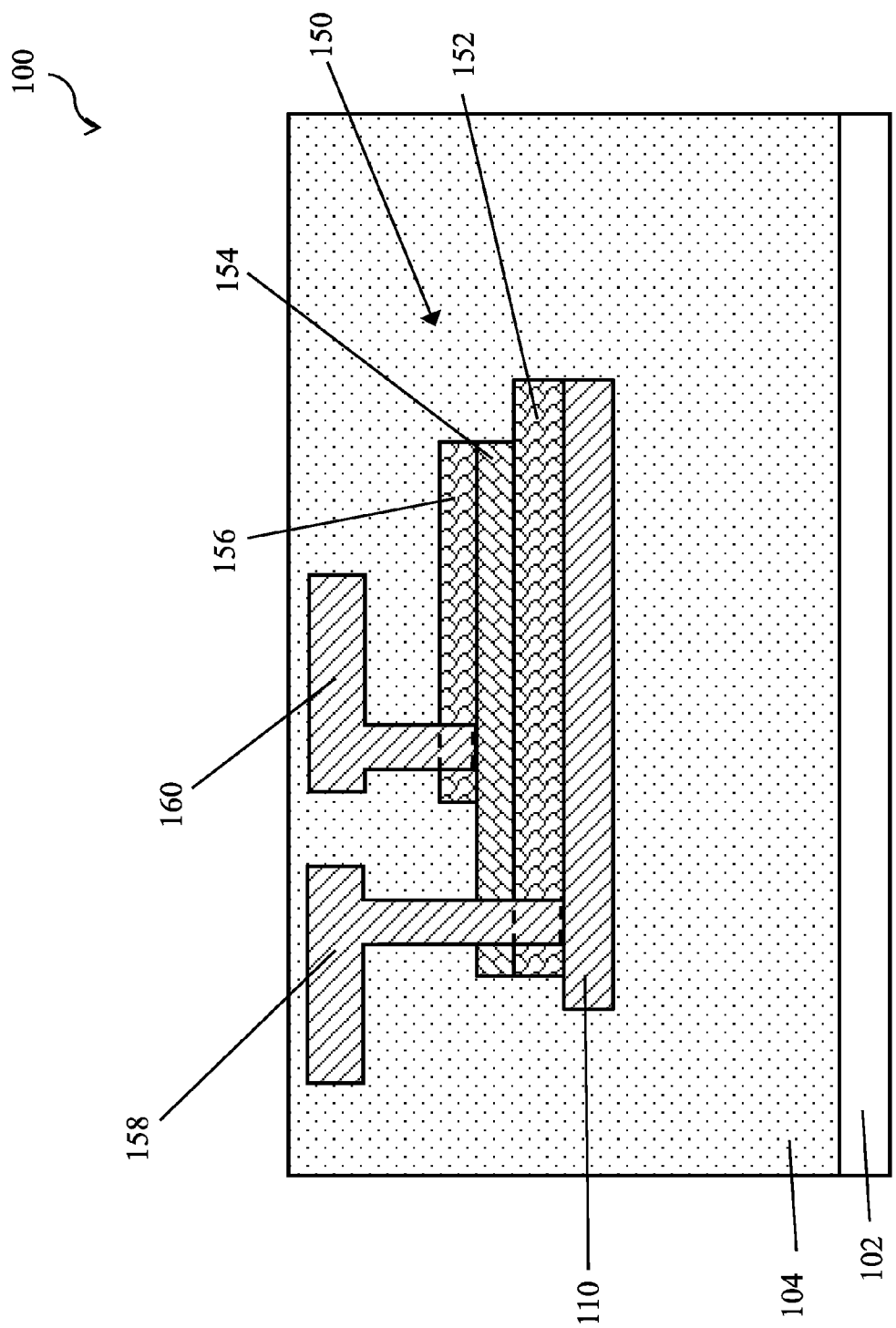
FIG. 1A is a cross-sectional view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a cross-sectional view of a semiconductor device 100 in accordance with some embodiments. Semiconductor device 100 includes a substrate 102. An interconnect structure 104 is over substrate 102. Interconnect structure 104 includes a plurality of conductive elements for electrically connecting active devices within substrate 102. A conductive element 110 is in a metal layer within interconnect structure 104. A capacitor 150 is formed in electrical contact with conductive element 110. Capacitor 150 includes a first graphene structure 152 in electrical contact with conductive element 110. First graphene structure 152 includes a plurality of layers of graphene. A dielectric layer 154 is over first graphene structure 152. A second graphene structure 156 is over dielectric layer 154. Second graphene structure 156 includes a plurality of graphene layers. Dielectric layer 154 is positioned between first graphene structure 152 and second graphene structure 156 in order to form a capacitor structure. A first contact structure 158 is electrically connected to first graphene structure 152. First contact structure 158 is configured to transfer charge into and out of first graphene structure 152. A second contact structure 160 is electrically connected to second graphene structure 156. Second contact structure 160 is configured to transfer charge into and out of second graphene structure 156.

Substrate 102 includes active devices or passive devices. In some embodiments, the active devices include transistors, thyristors, or other suitable active devices. In some embodiments, the passive devices include resistors or other suitable passive devices. In some embodiments, substrate 102 includes memory cells or processing circuitry.

Interconnect structure 104 includes a plurality of conductive structures configured to electrically connect active devices and passive devices within substrate 102. In some embodiments, the conductive structures include copper, aluminum, tungsten, or another suitable conductive material. Interconnect structure 104 also includes passive devices, such as capacitor 150, resistors, or other suitable passive devices. Interconnect structure 104 includes a dielectric material surrounding the plurality of conductive structures in order to help reduce cross-talk between adjacent conductive structures. In some embodiments, the dielectric material includes silicon oxide, silicon nitride, silicon oxynitirde, or another suitable dielectric material. In some embodiments, interconnect structure 104 includes contact pads for connecting to other substrates. In some embodiments, the contact pads are usable to form a three-dimensional integrated circuit (3DIC).

Conductive element 110 is one of the plurality of conductive structures of interconnect structure 104. In some embodiments, conductive element 110 includes copper, aluminum, tungsten or another suitable conductive material. Conductive element 110 is usable to connect active devices or passive devices in substrate 102. Conductive element 110 is also usable to transfer charge into a layer of first graphene structure 152 closest to substrate 102.

Capacitor 150 is over conductive element 110. Capacitor 150 is usable to store charge within interconnect structure 104. Capacitor 150 is also usable to help reduce fluctuations in voltage passing through interconnect structure 104. Capacitor 150 includes first graphene structure 152 and second graphene structure 154.

Graphene is a layer of carbon atoms arranged in a two-dimensional array. The carbon atoms are arranged in a hexagonal pattern. The two-dimensional array of carbon atoms helps to reduce transfer of electrical charge between separate layers of graphene. The use of graphene as electrodes in capacitor 150 helps to increase an amount of charge carrier storage ability per unit area in comparison with other electrode materials.

In contrast, metallic electrodes are capable of transferring charge carriers in both a direction parallel to a top surface of substrate 102 and a direction perpendicular to the top surface of substrate 102. As a result, the metallic electrodes store charge carriers near external surfaces of the electrodes. Storing charge carriers mainly near surfaces of the metallic electrodes means that middle portions of the metallic electrodes are not used to store charge carrier, which reduces charge carrier storage per unit area. By increasing charge carrier storage ability per unit area, an overall area of the electrodes are able to be reduced while maintaining charge storage ability in order to help reduce an overall size of a semiconductor device.

Use of graphene electrodes instead of metallic electrodes also helps to reduce the need to use expensive high-k dielectric materials, such as zirconium oxide or hafnium oxide. Graphene electrodes also make it possible to reduce the need to use slower expensive formation techniques, such as atomic layer deposition (ALD). As a result, the use of graphene electrode also helps to increase throughput and reduce cost during a manufacturing process in comparison with metallic electrodes. The two-dimensional array structure of graphene also helps to facilitate tuning of an overall capacitance of capacitor 150 by adjusting a number of layers in a graphene structure.

First graphene structure 152 includes plurality of layers of graphene. A number of layers within first graphene structure 152 is selected based on a desired storage capacity of capacitor 150. In some embodiments, a number of layers in first graphene structure 152 ranges from about 2 layers to about 20 layers. In some embodiments, the number of layers is greater than 20 layers in order to further increase an overall storage capacity of capacitor 150. Each of the layers in first graphene structure 152 resists transfer of charge carriers to adjacent layers of the first graphene structure. Even when a charge difference exists between adjacent layers, the two-dimensional array of carbon atoms in first graphene structure 152 resists transfer of charge carriers between layers.

Dielectric layer 154 is over first graphene structure 152. In some embodiments, an area of the dielectric layer 154 matches an area of first graphene structure 152. In some embodiments, first graphene structure 152 includes a portion which is exposed by dielectric layer 154. In some embodiments, dielectric layer 154 includes silicon oxide, silicon nitride, or another suitable dielectric material. In some embodiments, a material of dielectric layer 154 is a same material as the dielectric material of interconnect structure 104. In some embodiments, the material of dielectric layer is different from the material of the dielectric material of interconnect structure 104. In some embodiments, a thickness of dielectric layer 154 ranges from about 100 angstroms (Å) to about 500 Å. If the thickness of dielectric layer 154 is too small, the dielectric layer is not capable of sufficiently insulating first graphene structure 152 from second graphene structure 156 and charge is directly exchanged between the first graphene structure and the second graphene structure, in some embodiments. If the thickness of dielectric layer 154 is too large, a leakage of capacitor 150 increases above an acceptable level, in some embodiments.

Second graphene structure 156 includes plurality of layers of graphene. In some embodiments, an area of second graphene structure 156 is less than an area of first graphene structure 152 or an area of dielectric layer 154. In some embodiments, the area of second graphene structure 156 is equal to or greater than the area of first graphene structure 152 or the area of dielectric layer 154. A number of layers within second graphene structure 156 is selected based on a desired storage capacity of capacitor 150. In some embodiments, a number of layers in second graphene structure 156 ranges from about 2 layers to about 20 layers. In some embodiments, the number of layers is greater than 20 layers in order to further increase an overall storage capacity of capacitor 150. In some embodiments, the number of layers in second graphene structure 156 is equal to the number of layers in first graphene structure 152. In some embodiments, the number of layers in second graphene structure 156 is different from the number of layers in first graphene structure 152. Each of the layers in second graphene structure 156 resists transfer of charge carriers to adjacent layers of the second graphene structure. Even when a charge difference exists between adjacent layers, the two-dimensional array of carbon atoms in second graphene structure 156 resists transfer of charge carriers between layers.

First contact structure 158 is configured to electrically connect to first graphene structure 152. In some embodiments, first contact structure 158 is a cathode. In some embodiments, first contact structure 158 is an anode. In some embodiments, first contact structure 158 includes a conductive material, e.g., copper, aluminum, tungsten, or another suitable conductive material. In some embodiments, first contact structure 158 further includes a barrier layer, e.g., tantalum nitride, titanium nitride, or another suitable barrier layer. The barrier layer helps to prevent or minimize conductive material from first contact structure from diffusing into first graphene structure 152. In some embodiments, first contact structure 158 extends through both dielectric layer 154 into first graphene structure 152. In some embodiments, first contact structure 158 extends into a portion of first graphene structure 152 exposed by dielectric layer 154.

Due to the resistance to charge transfer to between separate layers of first graphene structure 152, first contact structure 158 extends into the first graphene structure to contact multiple layers of graphene in order to enhance charge transfer between the first contact structure and the first graphene structure. In some embodiments, first contact structure 158 contacts all graphene layers in first graphene structure 152. In some embodiments, first contact structure 158 contacts less than all graphene layers in first graphene structure 152.

Second contact structure 160 is configured to electrically connect to second graphene structure 156. In some embodiments, second contact structure 160 is a cathode. In some embodiments, second contact structure 160 is an anode. In some embodiments, second contact structure 160 includes a conductive material, e.g., copper, aluminum, tungsten, or another suitable conductive material. In some embodiments, second contact structure 160 further includes a barrier layer, e.g., tantalum nitride, titanium nitride, or another suitable barrier layer. The barrier layer helps to prevent or minimize conductive material from first contact structure from diffusing into second graphene structure 160.

Due to the resistance to charge transfer to between separate layers of second graphene structure 156, second contact structure 160 extends into the second graphene structure to contact multiple layers of graphene in order to enhance charge transfer between the second contact structure and the second graphene structure. In some embodiments, second contact structure 160 contacts all graphene layers in second graphene structure 156. In some embodiments, second contact structure 160 contacts less than all graphene layers in second graphene structure 156. In some embodiments, second contact structure 160 extends through second graphene structure 156 into dielectric layer 154.

Figure 1B:
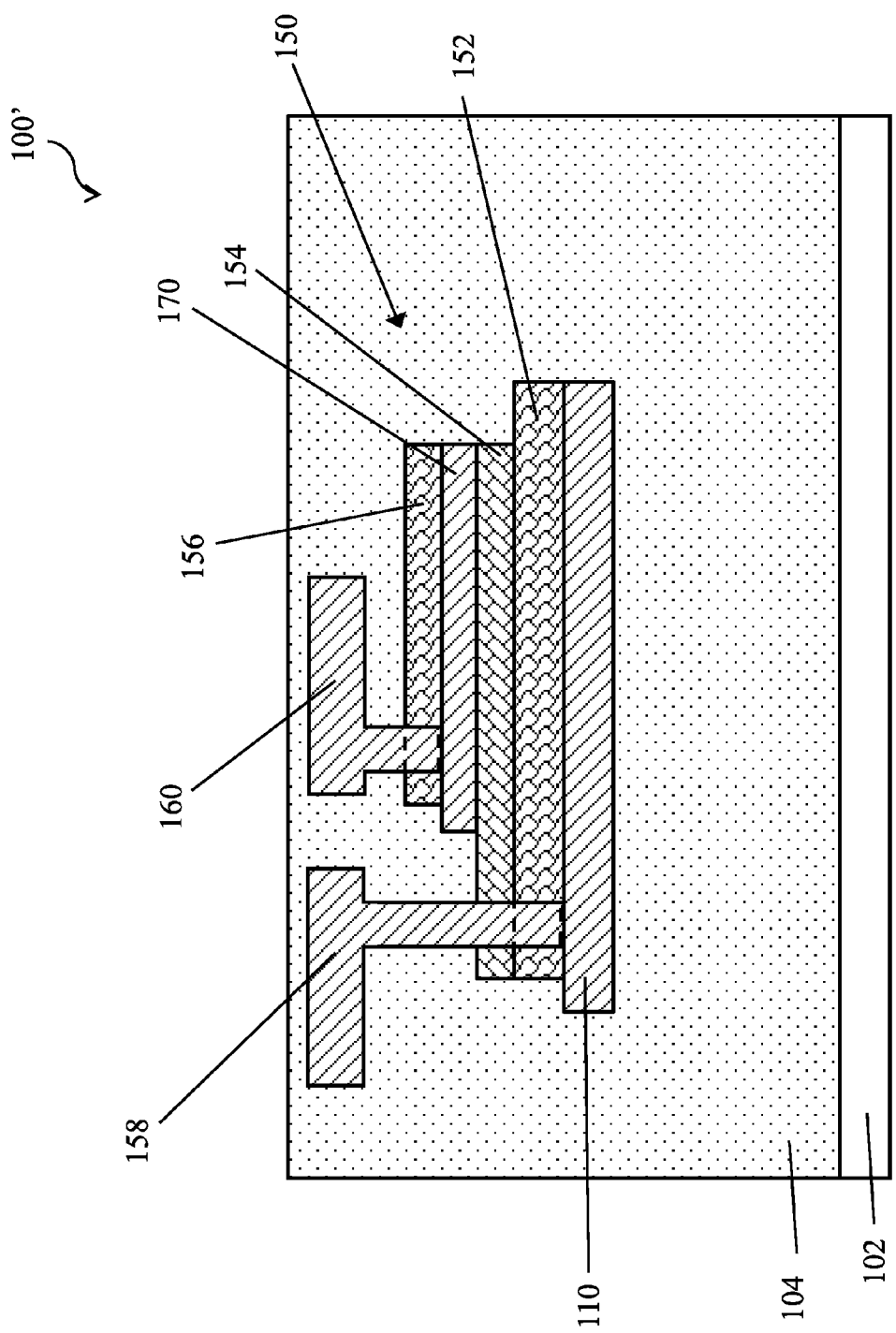
FIG. 1B is a cross-sectional view of a semiconductor device in accordance with some embodiments.

FIG. 1B is a cross-sectional view of a semiconductor device 100' in accordance with some embodiments. Semiconductor device 100' is similar to semiconductor device 100 and similar elements have a same reference number. In comparison with semiconductor device 100, semiconductor device 100' includes a growth layer 170 between dielectric layer 154 and second graphene structure 156.

Growth layer 170 is used to enhance an ability to form second graphene structure 156 over dielectric layer 154. In order to form second graphene structure 156 of semiconductor device 100 having a suitable resistivity over dielectric layer 154, a growth temperature of about 700° C. is used to form the second graphene structure. This growth temperature can be potentially damaging to back end process structures such as interconnect structure 104. The growth temperature causes diffusion of conductive material from conductive elements within interconnect structure 104 into surrounding dielectric material. This diffusion will decrease an ability of the surrounding dielectric material to reduce cross-talk between neighboring conductive elements.

In contrast, semiconductor device 100' includes growth layer 170 between dielectric layer 154 and second graphene structure 156 in order to reduce a growth temperature of the second graphene structure of semiconductor device 100'. In some embodiments, the growth temperature of second graphene structure 156 on growth layer 170 ranges from about 400° C. to about 600° C. This lower growth temperature helps reduce the risk of damage to back end processing structures such as interconnect structure 104.

In some embodiments, growth layer 170 includes copper, aluminum, tungsten or another suitable material. In some embodiments, growth layer 170 has a thickness ranging from about 100 nanometers (nm) to about 500 nm. In some embodiments, if the thickness of growth layer 170 is too small, the growth layer is not able to sufficiently assist in formation of second graphene structure 156. If the thickness of growth layer 170 is too great, size of semiconductor device 100' is increased without a significant increase in formation ability of second graphene structure 156.

Figure 2:
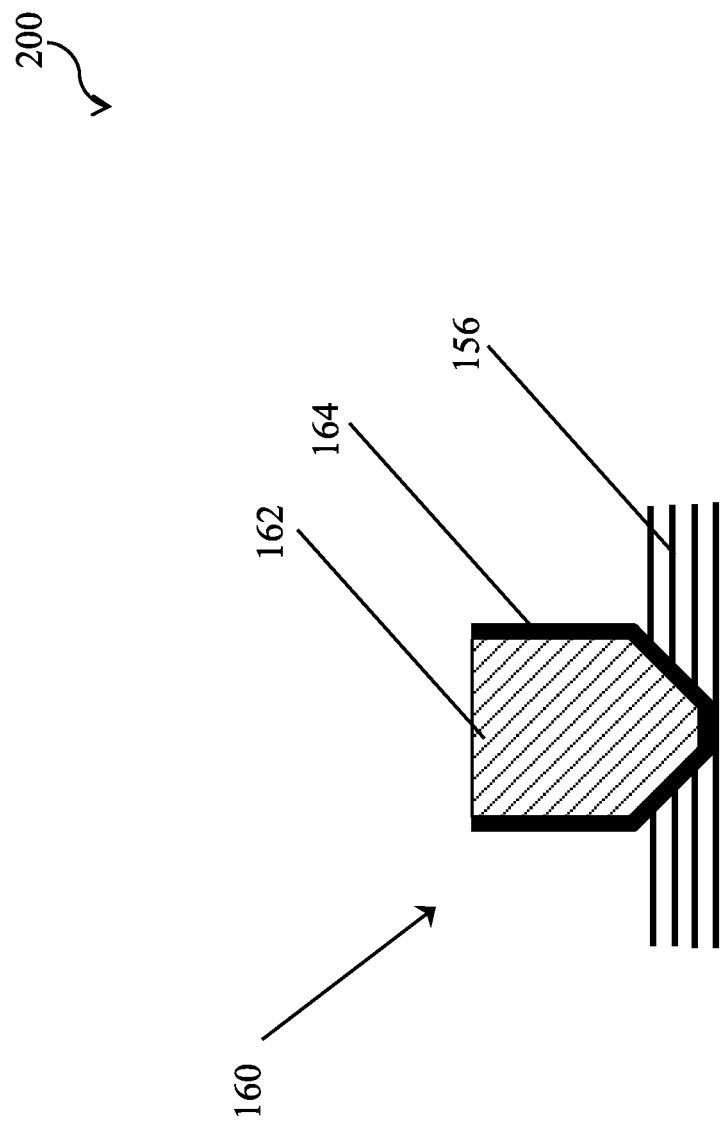
FIG. 2 is a cross-sectional view of a contact structure for a capacitor in accordance with some embodiments.

FIG. 2 is a cross-sectional view of a contact structure 200 in accordance with some embodiments. Contact structure 200 is indicated as an example of second contact structure 160 (FIG. 1A). Although discussed with respect to contact structure 160, the details of contact structure 200 are also applicable to first contact structure 158. Contact structure 200 includes a conductive material 162 surrounded by a barrier layer 164. Contact structure 200 extends into an opening in second graphene structure 156. In some embodiments, the opening in second graphene structure 156 has substantially vertical sidewalls. Substantially is used here to account for variation from vertical attributable to production variation during manufacturing of contact structure 200. In some embodiments, the opening in second graphene structure 156 has tapered sidewalls. The tapered sidewalls of the opening mean that a width of the opening closest to dielectric layer 154 (FIG. 1A) is less than a width of the opening farthest from the dielectric layer.

In some embodiments, contact structure 200 extends completely through second graphene structure 156 in order to contact all graphene layers within the second graphene structure. In some embodiments, contact structure 200 extends only partially through second graphene structure 156.

Conductive material 162 is usable to transfer charge carriers into and out of second graphene structure 156. In some embodiments, conductive material 162 includes copper, aluminum, tungsten or another suitable conductive material.

Barrier layer 164 helps to prevent or minimize diffusion of carbon from second graphene structure 156 into conductive layer 162 and helps to prevent or minimize diffusion of conductive material 162 into the second graphene structure. In some embodiments, barrier layer 164 includes tantalum nitride, titanium nitride, or another suitable barrier material.

Figure 3:
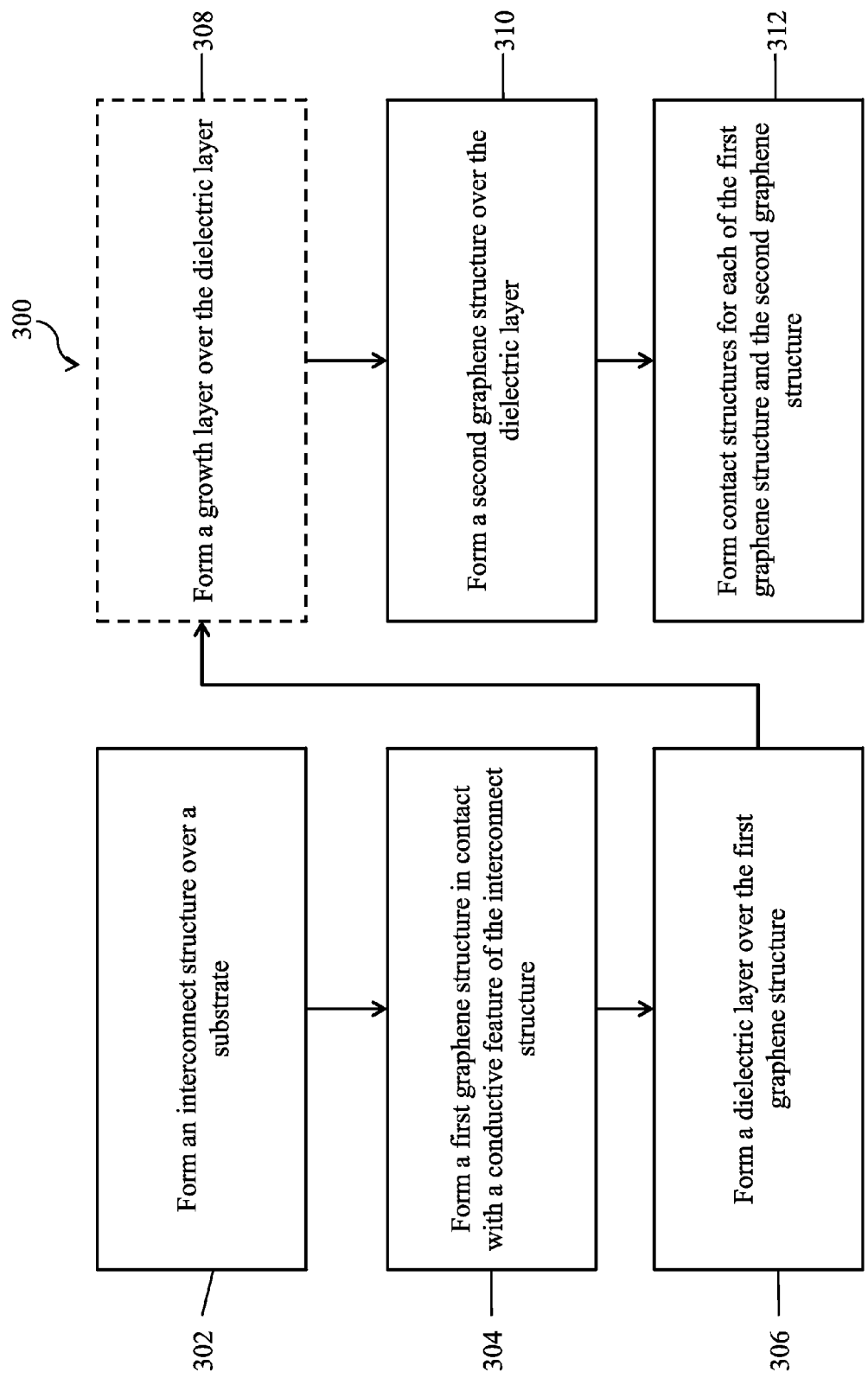
FIG. 3 is a flowchart of a method of making a semiconductor device in accordance with some embodiments.

FIG. 3 is a flowchart of a method 300 of making a semiconductor device according to some embodiments. Method 300 begins with operation 302 in which an interconnect structure is formed over a substrate. In some embodiments, the interconnect structure, e.g., interconnect structure 104 (FIG. 1A), is formed over the substrate, e.g., substrate 102, by forming a dielectric material over the substrate. In some embodiments, the dielectric material is formed over the substrate by physical vapor deposition (PVD), chemical vapor deposition (CVD), atomic layer deposition (ALD), spin-on coating, or another suitable formation technique.

Conductive features are formed in the dielectric material by a dual damascene process, in some embodiments. The conductive features electrically connect active devices or passive devices in the substrate. In some embodiments, the conductive features include copper, aluminum, tungsten or another suitable conductive material.

In operation 304, a first graphene structure is formed in contact with a conductive feature of the interconnect structure. The first graphene structure, e.g., first graphene structure 152 (FIG. 1A), includes a plurality of graphene layers. In some embodiments, a number of graphene layers in the first graphene structure ranges from about 2 layers to about 20 layers. In some embodiments, the first graphene structure is formed over the conductive structure by CVD. In some embodiments, the first graphene structure is formed using a precursor which includes methane ($CH_4$) and hydrogen ($H_2$). During the CVD process, the gas flow and the temperature are selected such that the graphene is efficiently grown on the conductive structure. In some embodiments, the CVD process includes multiple steps. In some embodiments, the CVD process includes four steps. The first step uses only $H_2$ gas and heats the semiconductor device to a target deposition temperature with a first duration. The second step uses $H_2$ gas and maintains the semiconductor device at the target deposition temperature for a second duration. The third step uses $H_2$ and $CH_4$ for deposition of graphene at the target deposition temperature. The gas $CH_4$ and $H_2$ are maintained with a gas flow ratio $CH_4/H_2$ greater than one. In the fourth step the semiconductor device is cooled down. In some embodiments, maintaining the semiconductor device at the target deposition temperature at the second step and the third step includes maintaining the CVD deposition chamber at a pressure ranging between about 1 Torr and about 4 Torr. In some embodiments, the target deposition temperature ranges between about 400° C. and about 1000° C.

In operation 306, a dielectric layer is formed over the first graphene structure. The dielectric layer, e.g., dielectric layer 154 (FIG. 1A), is formed by PVD, CVD, ALD, spin-on coating or another suitable formation technique, in some embodiments. In some embodiments, the dielectric layer includes silicon oxide, silicon nitride, silicon oxynitride, silicon carbide, or another suitable dielectric material. In some embodiments, the dielectric layer includes a same material as the dielectric material of the interconnect structure. In some embodiments, the dielectric layer includes a different material from the dielectric material of the interconnect structure.

In some embodiments, the dielectric layer is formed over an entirety of the first graphene structure. In some embodiments, the dielectric layer is formed to expose a portion of the first graphene structure. In some embodiments, the dielectric layer is formed over the entirety of the first graphene structure and then a portion of the dielectric is removed to expose the portion of the first graphene structure.

In optional operation 308, a growth layer is formed over the dielectric layer. The growth layer, e.g., growth layer 170 (FIG. 1B), is used to assist in formation of a second graphene structure. The use of the growth layer reduces a growth temperature of the second graphene structure in comparison with forming the second graphene layer directly on the dielectric layer. In some embodiments, the growth layer includes a conductive material. In some embodiments, the conductive material includes copper, aluminum, tungsten, or another suitable conductive material. In some embodiments, the growth layer includes a same material as the conductive material in the interconnect structure. In some embodiments, the growth layer includes a different material from the conductive material in the interconnect structure. In some embodiments, the growth layer is formed by PVD, ALD, sputtering or another suitable formation method. In some embodiments, a thickness of the growth layer ranges from about 100 nm to about 500 nm. In some embodiments, the growth layer is formed over an entirety of the dielectric layer. In some embodiments, the growth layer is formed over less than the entirety of the dielectric layer. In some embodiments, the growth layer is formed over the entirety of the dielectric layer and then a portion of the growth layer is removed to expose a portion of the dielectric layer. In some embodiments, the growth layer is omitted when the back end processing elements of the semiconductor device are able to withstand a higher formation temperature.

In operation 310, a second graphene structure is formed over the growth layer. The second graphene structure, e.g., second graphene structure 156 (FIG. 1B), includes a plurality of graphene layers. In some embodiments, a number of graphene layers in the first graphene structure ranges from about 2 layers to about 20 layers. In some embodiments, the number of layers in the second graphene structure is equal to the number of layers in the first graphene structure. In some embodiments, the number of layers in the second graphene structure is different from the number of layers in the first graphene structure. In some embodiments, the second graphene structure is formed over the growth layer by a process similar to that described above with respect to the first graphene structure. In some embodiments, the second graphene structure is formed using a same temperature as the first graphene structure. In some embodiments, the second graphene structure is formed using a different temperature from the first graphene structure. In some embodiments, the second graphene structure is formed over the entirety of the dielectric layer. In some embodiments, the second graphene structure is formed over less than the entirety of the dielectric layer. In some embodiments where operation 308 is omitted, second graphene structure is formed directly on the dielectric layer.

In operation 312, contact structures are formed in each of the first graphene structure and the second graphene structure. The contact structures include a first contact structure, e.g., first contact structure 158 (FIG. 1A), in the first graphene structure. The contact structure further include a second contact structure, e.g., second contact structure 160 (FIG. 1A), in the second graphene structure. The contact structures are formed by forming an opening in each of the first graphene structure and the second graphene structures. In some embodiments, at least one of the openings includes substantially vertical sidewalls. In some embodiments, at least one of the openings includes tapered sidewalls.

The contact structures include a conductive material and a barrier layer. In some embodiments, the conductive material includes copper aluminum, tungsten or another suitable conductive material. In some embodiments, the conductive material of the first contact structure is the same as the conductive material of the second contact structure. In some embodiments, the conductive material of the first contact structure is different from the conductive material of the second contact structure. In some embodiments, the conductive material includes a same material as at least one of the growth layer or the conductive material of the interconnect structure. In some embodiments, the conductive material includes a different material from both the growth layer and the conductive material of the interconnect structure.

The barrier layer is located between the conductive material and the first graphene structure or the second graphene structure. In some embodiments, the barrier layer includes tantalum oxide, titanium oxide, or another suitable barrier material. In some embodiments, the barrier layer for the first contact structure is the same as the barrier layer for the second contact structure. In some embodiments, the barrier layer for the first contact structure is different from the barrier layer of the second contact structure.

The contact structures extend at least partially through the first graphene structure and the second graphene structure in order to contact multiple graphene layers. In some embodiments, the first contact structure extends through all graphene layers of the first graphene structure. In some embodiments, the first contact structure extends through less than all of the graphene layers of the first graphene structure. In some embodiments, the second contact structure extends through all graphene layers of the second graphene structure. In some embodiments, the second contact structure extends through less than all of the graphene layers of the second graphene structure.

In some embodiments, method 300 includes additional operations. In some embodiments, an order of the operations of method 300 is changed.

One aspect of this description relates to a capacitor. The capacitor includes a first graphene structure having a first plurality of graphene layers. The capacitor further includes a dielectric layer over the first graphene structure. The capacitor further includes a second graphene structure over the dielectric layer, wherein the second graphene structure has a second plurality of graphene layers.

Another aspect of this description relates to a semiconductor device. The semiconductor device includes a substrate and an interconnect structure over the substrate, the interconnect structure having a plurality of conductive features. The semiconductor device further includes a capacitor in the interconnect structure. The capacitor is in electrical contact with at least one conductive feature of the plurality of conductive features. The capacitor includes a first graphene structure having a first plurality of graphene layers. The capacitor further includes a dielectric layer over the first graphene structure. The capacitor further includes a second graphene structure over the dielectric layer, the second graphene structure having a second plurality of graphene layers.

Still another aspect of this description relates to a method of making a capacitor. The method includes forming a first graphene structure having a first plurality of graphene layers. The method further includes forming a dielectric layer over the first graphene structure. The method further includes forming a second graphene structure over the dielectric layer, wherein the second graphene structure includes a second plurality of graphene layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a capacitor, the method comprising:
   forming a first graphene structure having a first plurality of graphene layers, wherein forming the first graphene structure comprises selecting a number of layers in the first plurality of graphene layers in accordance with a desired charge storage capacity of the capacitor;
   forming a dielectric layer over the first graphene structure, wherein the first graphene structure extends laterally past a sidewall of the dielectric layer;
   forming a conductive growth layer over the dielectric layer, wherein the dielectric layer extends laterally past a sidewall of the conductive growth layer; and
   forming a second graphene structure over the dielectric layer, wherein the second graphene structure is in contact with the conductive growth layer, wherein the second graphene structure includes a second plurality of graphene layers, and wherein the dielectric layer extends laterally past a sidewall of the second graphene structure.

2. The method of claim 1, wherein the first graphene structure extends laterally past a sidewall of the second graphene structure.

3. The method of claim 1, wherein the first graphene structure has a first lateral dimension measured between opposing sidewalls of the first graphene structure, wherein the second graphene structure has a second lateral dimension measured between opposing sidewalls of the second graphene structure, and wherein the first lateral dimension is greater than the second lateral dimension.

4. The method of claim 1, wherein the capacitor is disposed over a semiconductor substrate comprising an active device, and wherein forming the first graphene structure comprises forming the first graphene structure in contact with an interconnect structure electrically connected to the active device.

5. The method of claim 1, wherein the conductive growth layer extends laterally past a sidewall of the second graphene structure.

6. The method of claim 1, wherein the conductive growth layer comprises copper, aluminum, or tungsten, and wherein the conductive growth layer reduces a growth temperature of the second plurality of graphene layers.

7. The method of claim 1, wherein the conductive growth layer extends laterally past the sidewall of the second graphene structure.

8. The method of claim 1, further comprising:
   etching an first opening in the first graphene structure;
   forming a first contact extending through the first opening and electrically connected to the first graphene structure;
   etching a second opening in the second graphene structure; and
   forming a second contact extending through the second opening and electrically connected to the second graphene structure.

9. The method of claim 8, wherein the second contact has vertical sidewalls over the second graphene structure.

10. The method of claim 9, wherein the second contact has tapered sidewalls in the second opening and connected to the vertical sidewalls.

11. The method of claim 1, wherein a first sidewall of the dielectric layer is co-terminus with a second sidewall of the first plurality of graphene layers, and wherein a second sidewall of the dielectric layer opposite the first sidewall is co-terminus with a third sidewall of the second plurality of graphene layers.

12. The method of claim 1, further comprising forming a contact to the first graphene structure, the contact physically contacting each of the first plurality of graphene layers.

13. The method of claim 12, wherein the contact extends through the dielectric layer.

14. A method of making a capacitor, the method comprising:
   forming a first graphene structure having a first plurality of graphene layers, wherein forming the first graphene structure comprises selecting a number of layers in the first plurality of graphene layers in accordance with a desired charge storage capacity of the capacitor;
   forming a dielectric layer over the first graphene structure, wherein the first graphene structure extends laterally past a sidewall of the dielectric layer; and
   forming a second graphene structure over the dielectric layer, wherein the second graphene structure includes a second plurality of graphene layers, and wherein the dielectric layer extends laterally past a sidewall of the second graphene structure, wherein forming the second graphene structure over the dielectric layer comprises:
      forming a conductive growth layer in contact with the dielectric layer, wherein the conductive growth layer comprises a conductive material different than graphene;
      forming the second graphene structure in contact with the conductive growth layer; and
   forming an interconnect structure electrically connected to an active device in a semiconductor substrate, wherein forming the first graphene structure comprises forming the first graphene structure in contact with the interconnect structure.

15. The method of claim 14, wherein an area of the dielectric layer is less than the area of the first graphene structure.

16. The method of claim 14, wherein a number of graphene layers in the second graphene structure is equal to the number of graphene layers in the first graphene structure.

17. The method of claim 14, wherein a number of graphene layers in the second graphene structure is different than the number of graphene layers in the first graphene structure.

18. The method of claim 14, wherein an entirety of a bottom surface of the conductive growth layer is in contact with the dielectric layer, wherein the dielectric layer extends laterally past a sidewall of the conductive growth layer, and wherein the conductive growth layer extends laterally past a sidewall of the second graphene structure.

19. A method of making a capacitor, the method comprising:
    forming a first graphene structure having a first plurality of graphene layers, wherein forming the first graphene structure comprises selecting a number of layers in the first plurality of graphene layers in accordance with a desired charge storage capacity of the capacitor, wherein the first graphene structure has a first lateral dimension measured between opposing sidewalls of the first graphene structure;
    forming a dielectric layer over the first graphene structure, the dielectric layer having a second lateral dimension measured between opposing sidewalls of the dielectric layer, wherein the first graphene structure extends laterally past a sidewall of the dielectric layer;
    forming a second graphene structure over the dielectric layer, wherein the second graphene structure includes a second plurality of graphene layers, the second graphene structure having a third lateral dimension measured between opposing sidewalls of the second graphene structure, wherein the dielectric layer extends laterally past a sidewall of the second graphene structure, wherein the first lateral dimension is greater than the second lateral dimension and the third lateral dimension, wherein the second lateral dimension is greater than the third lateral dimension, and wherein the first graphene structure extends laterally past a sidewall of the second graphene structure; and
    forming an interconnect structure electrically connected to an active device in a semiconductor substrate, wherein the capacitor is formed over and in contact with the interconnect structure, wherein the interconnect structure has a fourth lateral dimension measured between opposing sidewalls of the interconnect structure, wherein the fourth lateral dimension is greater than the first lateral dimension.

20. The method of claim 19, further comprising an electrical contact extending at least partially into the first graphene structure, wherein the electrical contact comprises:
    tapered sidewalls in the first graphene structure; and
    straight sidewalls over the first graphene structure.

21. The method of claim 20, further comprising forming a conductive growth layer on the dielectric layer, wherein forming the second graphene structure comprises depositing the second graphene structure on the conductive growth layer using a chemical vapor deposition (CVD) process.

22. The method of claim 20, wherein the electrical contact extends through the dielectric layer.

* * * * *